(12) United States Patent
Angelopoulos et al.

(10) Patent No.: US 8,293,454 B2
(45) Date of Patent: *Oct. 23, 2012

(54) PROCESS OF MAKING A LITHOGRAPHIC STRUCTURE USING ANTIREFLECTIVE MATERIALS

(75) Inventors: Marie Angelopoulos, Cortlandt Manor, NY (US); Katherina E. Babich, Chappaqua, NY (US); Sean D. Burns, Hopewell Junction, NY (US); Allen H. Gabor, Katonah, NY (US); Scott D. Halle, Hopewell Juction, NY (US); Arpan P. Mahorowala, Bronxville, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/199,253

(22) Filed: Nov. 18, 2008

(65) Prior Publication Data

US 2009/0061355 A1    Mar. 5, 2009

Related U.S. Application Data

(63) Continuation of application No. 11/180,787, filed on Jul. 14, 2005, now abandoned.

(51) Int. Cl.
 *B32B 9/04* (2006.01)
 *G03F 7/075* (2006.01)
(52) U.S. Cl. ............... 430/272.1; 430/311; 430/313; 428/446; 528/27; 528/26
(58) Field of Classification Search .......... None
 See application file for complete search history.

(56) References Cited

U.S. PATENT DOCUMENTS

| | | | |
|---|---|---|---|
| 4,557,797 A | 12/1985 | Fuller et al. | |
| 5,614,640 A * | 3/1997 | Okawa | 549/215 |
| 6,218,078 B1 | 4/2001 | Lacoponi | |
| 6,268,457 B1 | 7/2001 | Kennedy et al. | |
| 6,410,209 B1 | 6/2002 | Adams et al. | |
| 6,420,088 B1 | 7/2002 | Angelopoulos et al. | |
| 6,503,689 B2 | 1/2003 | Zampini et al. | |
| 6,503,692 B2 | 1/2003 | Angelopoulos et al. | |
| 6,638,851 B2 | 10/2003 | Cowley et al. | |
| 6,653,048 B2 | 11/2003 | Brock et al. | |
| 6,660,645 B1 | 12/2003 | Bell et al. | |
| 6,686,124 B1 | 2/2004 | Angelopoulos et al. | |
| 6,730,454 B2 | 5/2004 | Pfeiffer et al. | |
| 2002/0052125 A1 | 5/2002 | Shafer, et al. | |
| 2002/0195419 A1 | 12/2002 | Pavelchek | |
| 2005/0274692 A1 | 12/2005 | Iwabuchi et al. | |
| 2005/0277058 A1 | 12/2005 | Hamada et al. | |
| 2005/0277755 A1 | 12/2005 | Iwabuchi et al. | |
| 2005/0277756 A1 | 12/2005 | Hamada et al. | |
| 2006/0177772 A1 * | 8/2006 | Abdallah et al. | 430/311 |
| 2006/0177774 A1 | 8/2006 | Abdallah et al. | |

FOREIGN PATENT DOCUMENTS

WO    WO2004/113417    * 12/2004

* cited by examiner

*Primary Examiner* — Deborah Chacko Davis
(74) *Attorney, Agent, or Firm* — Connolly Bove Lodge & Hutz LLP; Daniel P. Morris, Esq.

(57) ABSTRACT

A lithographic structure comprising: an organic antireflective material disposed on a substrate; and a silicon antireflective material disposed on the organic antireflective material. The silicon antireflective material comprises a crosslinked polymer with a $SiO_x$ backbone, a chromophore, and a transparent organic group that is substantially transparent to 193 nm or 157 nm radiation. In combination, the organic antireflective material and the silicon antireflective material provide an antireflective material suitable for deep ultraviolet lithography. The invention is also directed to a process of making the lithographic structure.

25 Claims, 1 Drawing Sheet

PROCESS OF MAKING A LITHOGRAPHIC STRUCTURE USING ANTIREFLECTIVE MATERIALS

This application is a Continuation of application Ser. No. 11/180,787, filed on Jul. 14, 2005 now abandoned, and for which priority is claimed under 35 U.S.C. §120, the entire contents of which are hereby incorporated by reference.

FIELD OF INVENTION

The invention relates to a process of making a lithographic structure using antireflective materials. In particular, the invention relates to a process of making a lithographic structure using a silicon antireflective material and an organic anti reflective material.

BACKGROUND OF THE INVENTION

In the process of making semiconductor devices a photoresist and an antireflective material are applied to a substrate. Photoresists are photosensitive films used to transfer an image to a substrate. A photoresist is formed on a substrate and then exposed to a radiation source through a photomask (reticle). Exposure to the radiation provides a photochemical transformation of the photoresist, thus transferring the pattern of the photomask to the photoresist. The photoresist is then developed to provide a relief image that permits selective processing of the substrate.

Photoresists are typically used in the manufacture of semiconductors to create features such as vias, trenches or combination of the two, in a dielectric material. In such a process, the reflection of radiation during exposure of the photoresist can limit the resolution of the image patterned in the photoresist due to reflections from the material beneath the photoresist. Reflection of radiation from the substrate/photoresist interface can also produce variations in the radiation intensity during exposure, resulting in non-uniform linewidths. Reflections also result in unwanted scattering of radiation exposing regions of the photoresist not intended, which again results in linewidth variation. The amount of scattering and reflection will vary from one region of the substrate to another resulting in further non-uniform linewidths.

With recent trends towards high-density semiconductor devices, there is a movement in the industry to use low wavelength radiation sources into the deep ultraviolet (DUV) light (300 nm or less) for imaging a photoresist, e.g., KrF excimer laser light (248 nm), ArF excimer laser light (193 nm), electron beams and soft x-rays. However, the use of low wavelength radiation often results in increased reflections from the upper resist surface as well as the surface of the underlying substrate.

Substrate reflections at ultraviolet and deep ultraviolet wavelengths are notorious for producing standing wave effects and resist notching which severely limit critical dimension (CD) control. Notching results from substrate topography and non-uniform substrate reflectivity which causes local variations in exposure energy on the resist. Standing waves are thin film interference or periodic variations of light intensity through the resist thickness. These light variations are introduced because planarization of the resist presents a different thickness through the underlying topography. Thin film interference plays a dominant role in CD control of single material photoresist processes, causing large changes in the effective exposure dose due to a tiny change in the optical phase. Thin film interference effects are described in "Optimization of optical properties of resist processes" (T. Brunner, SPIE 10 Proceedings Vol. 1466, 1991, 297).

Bottom anti-reflective coatings (BARCs) have been used with single material resist systems to reduce thin film interference with some success. However, BARCs do not provide control of topographic variations and do not address the differences in resist thickness. BARCs such as silicon nitride or silicon oxide typically follow the already existing topography, and thus, the BARC exhibits nearly the same thickness non-uniformity as the underlying material. Consequently, the BARC alone will generally not planarize topographic variations resulting from underlying device features. As a result, there will be a variation in exposure energy over the resist. Current trends to provide uniform topography via chemical/mechanical polishing still leaves significant variations in film thickness.

Variations in substrate topography also limits resolution and can affect the uniformity of photoresist development because the impinging radiation scatters or reflects in uncontrollable directions. As substrate topography becomes more complex with more complex circuit designs, the effects of reflected radiation becomes even more critical. For example, metal interconnects used on many microelectronic substrates are particularly problematic due to their topography and regions of high reflectivity.

One approach to variations in substrate topography is described in U.S. Pat. No. 4,557,797 (Fuller et al.). Another approach used to address variations in substrate topography is described in Adams et al., Planarizing AR for DUV Lithography, Microlithography 1999: Advances in Resist Technology and Processing XVI, Proceedings of SPIE, vol. 3678, part 2, pp 849-856, 1999, which discloses the use of a planarizing antireflective coating.

Although multimaterial patterning schemes exist in the prior art (see, U.S. Pat. No. 6,140,226; and R. D. Goldblett, et al. Proceedings of the IEEE 2000 International Technology Conference, p 261-263), there remains the need for new antireflective materials. Many of the prior antireflective materials contain silicon based intermediate materials that do not act as antireflective coatings, e.g. silicon oxide like materials require the use of an additional antireflective coating because they cannot be optically tuned to control reflections.

The present trend to 248 nm and 193 mm lithography and the demand for sub 200 nm features requires that new processing schemes be developed. To accomplish this, tools with higher numerical aperture (NA) are emerging. The higher NA allows for improved resolution but reduces the depth of focus of aerial images projected onto the resist. Because of the reduced depth of focus, a thinner resist is typically required. However, as the thickness of the resist is decreased, the resist becomes less effective as a mask for subsequent dry etch image transfer to the underlying substrate. Without significant improvement in the etch resistance exhibited by current single material resists, these systems cannot provide the necessary etch characteristics for high resolution lithography.

SUMMARY OF THE INVENTION

The invention is directed to a lithographic structure comprising: an organic antireflective material disposed on a substrate; and a silicon antireflective material disposed on the organic antireflective material. The silicon antireflective material comprises a crosslinked polymer with a $SiO_x$ backbone, a chromophore, and a transparent organic group that is substantially transparent to 193 mm or 157 nm radiation. In many instances, the silicon antireflective material will further comprise a reaction product resulting from the reaction of a thermal acid generator.

In combination, the organic antireflective material and the silicon antireflective material provide an antireflective material suitable for deep ultraviolet lithography. The lithographic structure is then used to pattern a substrate. The invention is also directed to a process of making a lithographic structure.

BRIEF DESCRIPTION OF THE DRAWINGS

This invention will be better understood by reference to the Detailed Description of the Invention when taken together with the attached drawings, wherein.

DETAILED DESCRIPTION OF THE INVENTION

Figure 1:
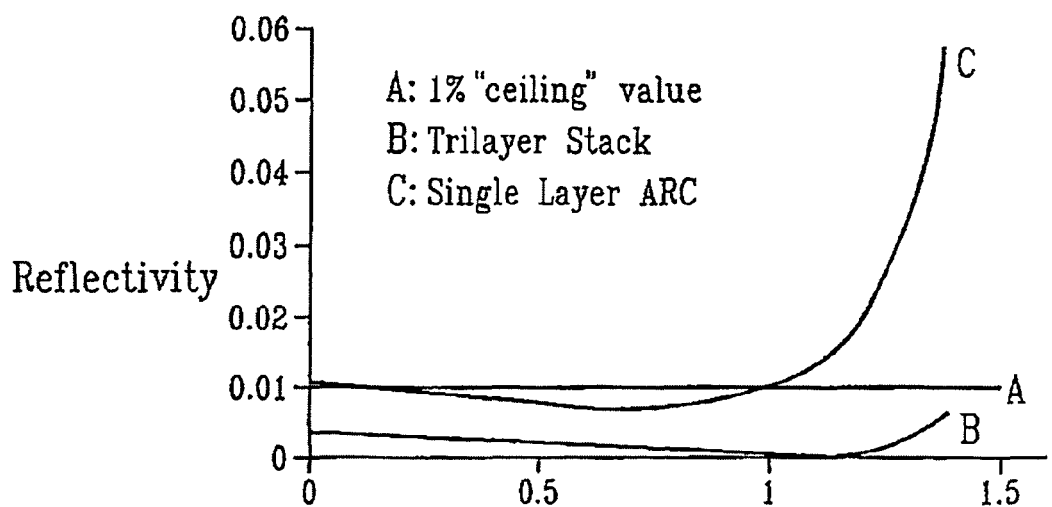
FIG. 1 is a simulated plot of reflectivity for an antireflective material in the art and for a silicon antireflective material disposed on an organic antireflective material according to the invention.
Figure 2A:
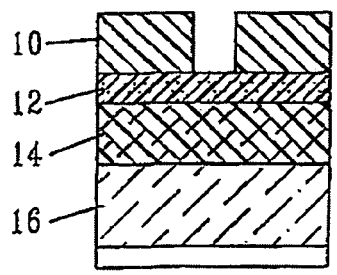
FIG. 2 is a schematic representation for the patterning of a substrate according to the invention.
Figure 2B:
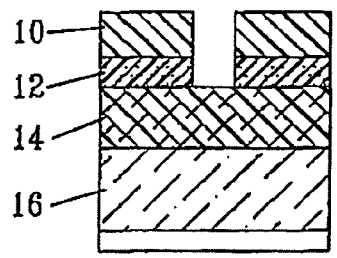
Figure 2C:
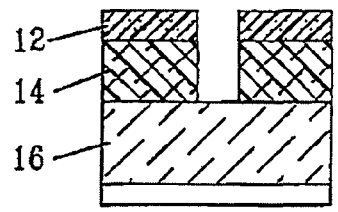
Figure 2D:
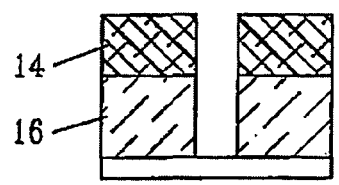
Figure 2E:
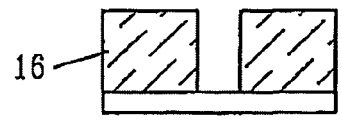

To address many of the lithographic processing issues summarized in the "Background of the Invention", applicants have developed a lithographic structure that includes a silicon antireflective material in combination with an organic antireflective material. The use of two antireflective materials provides the engineer with the process control and flexibility required for high resolution (low wavelength) lithography. For example, the engineer can selectively etch the organic antireflective material relative to the silicon antireflective material. As a result, once the silicon antireflective material is patterned, the underlying organic antireflective material can be etched with minimal removal of the silicon antireflective material.

For many lithographic imaging processes, the resists used do not provide sufficient resistance to subsequent etching steps to enable effective transfer of the resist pattern to a material underlying the resist. The resist typically gets consumed after transferring the pattern into the underlying BARC and substrates. In addition, the trend to smaller sub 90 nm node feature sizes requires the use of an ultra thin resist (>200 nm) to avoid image collapse. In many instances, if a substantial etching depth is required, or if it is desired to use certain etchants for a given underlying material, the resist thickness is now insufficient to complete the etch process.

Applicants' lithographic structure and process addresses many of the above issues by initially transferring the pattern onto a silicon antireflective material which then serves as an etch mask to continue transferring the pattern into a relatively thick organic antireflective material.

The invention also provides the process engineer with the optical tunability or flexibility to control the antireflective properties of the lithographic structure, if needed. Through the specific selection of silicon and organic antireflective materials a lithographic structure with the desired optical characteristics for high resolution, deep ultraviolet imaging is possible. Proper selection of optical constants for the silicon and organic antireflective materials can suppress the undesired reflectivity from the polarization nodes TE and TM (x and y polarization states) at high NA lithography.

The invention is directed to a lithographic structure comprising: an organic antireflective material disposed on a substrate; and a silicon antireflective material disposed on the organic antireflective material. The silicon antireflective material comprises a crosslinked polymer with a $SiO_x$ backbone and a chromophore attached to the $SiO_x$ backbone. The crosslinked, silicon oxide polymer also includes a transparent organic group that is substantially transparent to 193 nm or 157 nm radiation. In many instances, the silicon antireflective material will further comprise a reaction product resulting from the reaction of a thermal acid generator. The lithographic structures provides the needed optical and mechanical properties as well as etch selectivity.

The polymer is crosslinked through reactive sites on the polymer with an external crosslinking agent. Typically, the reactive site is a functional group, e.g., hydroxyl, on the chromophore or the organic transparent group. Alternatively, the polymer can include internal crosslinking groups, i.e., attached to one of the organic groups of the polymer, e.g., the chromophore or the organic transparent group.

The organic antireflective material is a crosslinked polymer with little, if any, silicon. The organic antireflective material can be formed by spin coating followed by crosslinking. Organic antireflective materials and the processes by which they are made are well known to those in the art of semiconductor processing.

The silicon antireflective material is optically tuned by careful selection of the chromophore, or the organic transparent group of the polymer. The degree of oxygen in the $SiO_x$ polymer also can be used to optically tune the silicon antireflective material. In addition, the selection of an organic antireflective material with the appropriate optical constants in combination with a selected silicon antireflective material can provide a semiconductor structure with excellent antireflective properties at 193 nm radiation, in particular at high NA lithography.

The silicon oxide polymer used to form the silicon antireflective material is preferably an organosiloxane, more preferably an organosilsesquioxane. Examples of suitable silicon oxide polymers of the silsesquioxane-type (ladder or network) have structures I to III below:

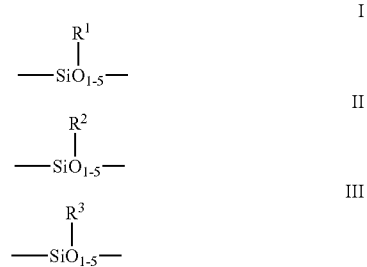

where $R^1$ comprises a chromophore, $R^2$ comprises an organic group transparent to 193 nm radiation, and $R^3$ comprises a reactive site available for crosslinking.

Examples of suitable silicon oxide polymers of the organosiloxane-type have structures IV to VI below:

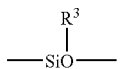

where $R^1$, $R^2$ and $R^3$ are as described above. The silicon oxide polymer can also contain various combinations of structures I to VI such that the average silicon oxide structure with a chromophore $R^1$ is represented as structure (VII) below and the average structure with a reactive site $R^2$ is represented by structure (VIII) below, and the average structure with a reactive site $R^3$ is represented by structure (IX) below.

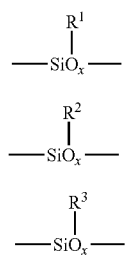

where x is from about 1 to about 1.5.

The silsesquioxane-type polymers (I to III) will often have superior etch resistance. Still, if the organosiloxane-type polymers are used (IV to VI), the degree of crosslinking is generally increased compared to formulations based on silsesquioxanes. In many cases, the silicon oxide polymer will have solution and film-forming characteristics conducive to forming a layered material by conventional spin-coating.

Exemplary silicon oxide polymer compositions used to provide the silicon antireflective material of the invention and methods of depositing such a material is described in U.S. Pat. Nos. 6,420,088 and 6,730,454, assigned to International Business Machines, the entire disclosures of which are incorporated herein by reference. A select listing of silicon oxide polymers that can be used are listed on column 4, line 45 to column 5 line 8 of U.S. Pat. No. 6,420,088.

Alternatively, the polymer compositions described in Japanese patent application 2004-158639, Japanese patent application 2003-157808 or Japanese patent application 2004-172222, the entire disclosures of which are incorporated herein by reference, can be used to provide the silicon antireflective material of the invention.

The following silicon oxide polymer depicted below provides a silicon antireflective material with optimal characteristics and performance.

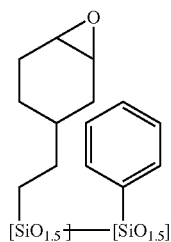

The chromophore-containing groups $R^1$ may contain any suitable chromophore which (i) can be grafted onto the silicon polymer (ii) has suitable radiation absorption characteristics, and (iii) does not adversely affect the performance of the material or any overlying photoresist material. Preferred chromophore moieties include chrysenes, pyrenes, fluoranthrenes, anthrones, benzophenones, thioxanthones, and anthracenes. Anthracene derivatives; such as those described in U.S. Pat. No. 4,371,605 can also be used. The chromophore 9-anthracene methanol is a preferred chromophore for 248 nm lithography.

Other chromophores suitable for this invention are described in U.S. Pat. No. 6,730,454; Japanese patent application 2004-158639; and Japanese patent application 2004-172222, the disclosures of which is incorporated herein by reference. An exemplary list include chromophores selected from the group consisting of phenyl, phenol, naphthalene, and an unsaturated organic group. The use of a phenyl chromophore for 193 nm lithography exhibits certain advantages over some of the other chromophores listed. Also, for 193 nm lithography, non-aromatic compounds with one or more unsaturated carbon-carbon bonds can be used.

The chromophore can be chemically attached to the silicon polymer by acid-catalyzed O-alkylation or C-alkylation such as by Friedel-Crafts alkylation. Alternatively, the chromophore can be chemically attached by esterification. For example, the chromophore can be attached via a hydroxyl-substituted aromatic group such as a hydroxybenzyl or hydroxymethylbenzyl group.

The selection of the transparent organic groups $R^2$ used will depend on the wavelength or character of the imaging radiation. In the case of 193 nm imaging radiation, the transparent organic groups are preferably bulky ($C_2$ or higher) organic radicals substantially free of unsaturated carbon-carbon bands. Organic transparent groups such as epoxides are particularly suited for 193 nm lithography. A cycloaliphatic epoxide exhibits exceptional characteristics for 193 nm lithography. Other functional groups such as an alcohol, acetoxy, ester and/or ether based transparent groups can also be used.

Organic transparent groups that can be used in the silicon antireflective materials are described in U.S. Pat. No. 6,730,454; Japanese patent application 2004-158639; and Japanese patent application 2004-172222. In many instances, the amount of transparent organic groups is preferably balanced with the amount of chromophore to provide a desired combination of energy absorption and antireflection character in the silicon antireflective material.

In the case of 157 nm imaging radiation, the organic transparent groups are preferably fluorine-containing groups such as a trifluoromethyl group or a perfluoroalkyl. Again, the amount of transparent organic groups is preferably balanced with the amount of chromophore to provide a desired combination of energy absorption and antireflection character in the silicon antireflective material.

The reactive site $R^3$ comprises alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides can be used.

The external crosslinking agent used to form the silicon antireflective material can be one that reacts with the silicon polymer and is catalyzed by an acid and/or by heat. Generally, the crosslinking agent can be any suitable crosslinking agent known in the negative photoresist art which is otherwise compatible with the other selected components of the polymer composition. Preferred crosslinking agents are glycoluril compounds such as tetramethoxymethyl glycoluril, methylpropyltetramethoxymethyl glycoluril, and methylphenyltetramethoxymethyl glycoluril, available as POWDERLINK® from Cytec Industries.

Other possible crosslinking agents include: 2,6-bis(hydroxymethyl)-p-cresol compounds such as those found in Japanese Laid-Open Patent Application (Kokai) No. 1-293339, etherified amino resins, for example methylated or butylated melamine resins (N-methoxymethyl- or N-butoxymethyl-melamine respectively), and methylated/butylated glycolurils, as can be found in Canadian Patent No. 1 204 547. Other crosslinking agents such as bis-epoxies or bis-phenols (e.g., bisphenol-A) can also be used. Combinations of two or more crosslinking agents can also be used.

The following crosslinker depicted below provides a silicon antireflective material with optimal characteristics and performance.

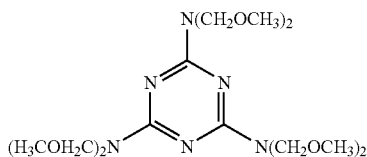

The silicon oxide polymer compositions used to form the silicon antireflective material will likely contain an acid generator, which is used to catalyze the crosslinking of the polymer. The acid generator can be a compound that liberates acid upon thermal treatment. A listing of known thermal acid generators include 2,4,4,6-trabromocyclohexadienone, benzoin tosylate, 2-nitrobenzyl tosylate and other alkyl esters of organic sulfonic acids. Compounds that generate a sulfonic acid upon activation are generally suitable. Other suitable thermally activated, acid generators are described in U.S. Pat. Nos. 5,886,102 and 5,939,236; the disclosures of these two patents as related to the thermally activated, acid generating compounds are incorporated herein by reference.

If desired, a radiation-sensitive acid generator can be used as an alternative to a thermally activated acid generator or in combination with a thermally activated acid generator. Examples of suitable radiation-sensitive acid generators are described in U.S. Pat. Nos. 5,886,102 and 5,939,236, the disclosures of these two patents as related to radiation sensitive, acid generating compounds are incorporated herein by reference. Other radiation-sensitive acid generators known in the resist art can be used as long as they are compatible with the other components of the polymer composition.

The following acid generator depicted below provides a silicon antireflective material with optimal characteristics and performance.

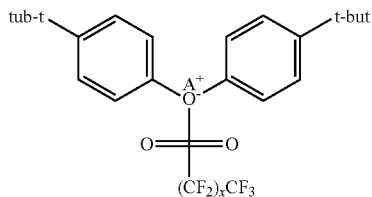

wherein A is S or I, and x is 0 to 7.

The silicon oxide polymer compositions can contain (on a solids basis) (i) about 50-98 wt. % of the silicon polymer, more preferably about 70-80 wt %, (ii) about 1-50 wt. % of crosslinking agent, more preferably about 3-25% wt %, and (iii) about 1-20 wt. % acid generator, more preferably about 1-15 wt. %.

The silicon oxide polymer compositions will generally contain a solvent. The solvent may be any solvent conventionally used with resists which otherwise does not have any excessively adverse impact on the performance of the antireflective composition. Exemplary solvents include propylene glycol monomethyl ether acetate, cyclohexanone, and ethyl lactate. The compositions can also contain small amounts of auxiliary components (e.g., base additives, etc.) known in the art.

The silicon oxide polymer compositions can be prepared by combining the silicon oxide polymer, crosslinking component and acid generator, and any other desired ingredients (e.g., solvent) using conventional methods. The silicon polymer compositions can be deposited on the organic antireflective material by spin-coating followed by heating to achieve crosslinking and solvent removal. The heating is preferably conducted at about 250° C. or less, more preferably about 150° C. to 220° C. The heating time will depend on the material thickness and temperature.

The organic antireflective material used in the lithographic structure can be any polymer containing the elements of carbon, hydrogen, oxygen and nitrogen and mixtures thereof, that can be spin applied and crosslinked with a heat treatment. Typical organic polymer compositions suitable for this invention are being used in lithographic applications such as organic BARCs or as planarizing undermaterials in bimaterial or other multimaterial lithographic schemes. The choice of the appropriate organic polymer composition will depend upon the optical constants as described in the section below. Examples of suitable organic polymer compositions are described in U.S. Pat. Nos. 6,503,689; 6,410,209; 6,686,124; and U.S. published application 20020058204A1, the entire disclosures of which are incorporated herein by reference.

The selection of which organic antireflective polymer composition to use will depend on several characteristics such as solubility, optical properties, thermal properties, mechanical properties, etch selectivity, and film forming ability. The resulting organic antireflective material will be suitable for low-wavelength radiation. Like the silicon oxide polymer described above, the organic polymer can have a plurality of different chemical groups each having a specific function in the overall performance of the material. Optical properties, mode of insolubilization, solubility enhancement, and etch resistance are among the properties that can be tailored by a judicious selection of the chemical groups.

Examples of suitable organic polymers that can be used include poly(4-hydroxystyrene), copolymers of 4-hydroxystyrene such as with up to 40 weight % of an alkyl methacrylate, alkylacrylate and/or styrene; novolac resins, acrylate polymers, methacrylate polymers, fluorocarbon polymers, and cycloaliphatic polymers such as norbornene-based and maleic anhydride polymers. Some examples of specific polymers include poly(3-hydroxystyrene), poly(acrylic acid), poly(norbonene carboxylic acid), copolymer of (4-hydroxystyrene and styrene), copolymer of 4-hydroxystyrene and acrylic acid, copolymer of styrene and acrylic acid, and copolymer of norbonene and maleic anhydride.

The lithographic structures comprising the silicon and organic antireflective materials will likely exhibit excellent reflectivity control in particular at 193 nm lithography with a numerical aperture greater than 0.75 NA. Reflectivity control is accomplished by providing the appropriate optical properties for each of the silicon and the organic antireflective materials. The chromophore and organic transparent groups are optimized to achieve the appropriate index of refraction (both real and imaginary; n and k respectively) at 193 nm or 157 nm wavelengths.

FIG. 1 shows a reflectivity simulation (software "Prolith" from KLA, Inc.) for a traditional, single antireflective material and for a lithographic structure with an antireflective material that comprises a silicon antireflective material and an organic antireflective material. The substrate reflectivity of 193 m radiation is plotted against the incident angle of the light. The angle is expressed as $n*\sin(\theta)$, where $\theta$ is the incident angle and n is the index of refraction of the imaging medium. This value is also known as the numerical aperture of the imaging system. In this case, the imaging medium is considered to have an index of refraction of 1.43, which is the index of refraction of water at 193 nm. This value is chosen to be consistent with the industry's choice of water as the imaging medium for immersion lithography, but the invention is not specific to any particular imaging medium.

In general, the organic antireflective material will have an index of refraction (n) of 1.3-2.0 and an extinction coefficient (k) of 0.4-0.9, at 193 nm radiation, and the silicon antireflective material will have an index of refraction (n) of 1.5-2.2 and an extinction coefficient (k) of 0.1-0.8, at 193 nm radiation. Ideally, the antireflective materials of the invention provide a semiconductor structure with a reflectivity below 0.5% up to NA=1.4, thus demonstrating excellent reflectivity control for a high NA lithography imaging process.

The optical constants and thickness used for the traditional antireflective material are n=1.8 and k=0.5 and a thickness of 30 nm. The optical constants and thickness used for the silicon and organic antireflective materials are n=1.75, k=0.2, thickness=35 nm and n=1.7, k=0.5, and thickness 200 nm, respectively. As shown, the traditional material reflectivity at low NA is adequate if below 1%. In general, it is desired to have an antireflective material structure that results in reflectivity below 1% of the incident light. However, at high NA (NA>1) the reflectivity increases sharply to values as high as 3-5%, which is typically considered unacceptable for a lithographic process. In comparison, applicants' lithographic structure provides a reflectivity below 0.5% up to NA=1.4, thus demonstrating excellent reflectivity control for a high NA lithography imaging process. It is to be understood, however, that it is not necessary to have the exact optical constants and thickness values shown in this example in order to attain low reflectivity, and in fact these values will vary depending upon the underlying film stack.

Table 1 provides a range of optical properties and thickness that may result in low reflectivity control depending upon the underlying film stack.

TABLE 1

| structure material | thickness (nm) | n | k |
|---|---|---|---|
| photoresist | n/a | 1.6-2.3 | 0-0.05 |
| silicon | 10-150 | 1.3-2.2 | 0-0.5 |
| organic | 20-500 | 1.3-2.2 | 0.2-1.0 |

The thickness of the silicon and organic antireflective materials depends upon the desired function. For most applications, the thickness of the silicon antireflective material is typically about 20 nm to 100 nm. To achieve complete planarization the desired film thickness of the organic antireflective material is typically about 100 nm to 500 nm. Generally, the silicon antireflective material will have a thickness of $T_k$ (in nanometers) and the organic antireflective material will have a thickness of about $2T_k$ to about $12T_k$. In many instances, the organic antireflective material will have a thickness of about $2T_k$ to about $6T_k$.

The silicon and organic antireflective material is especially advantageous for lithographic processes used in the manufacture of integrated circuits on semiconductor substrates. The lithographic structure is especially advantageous for lithographic processes using 193 nm, 157 nm, x-ray, e-beam or other imaging radiation. The composition is also especially useful for 193 nm high NA lithography with a numerical aperture (NA) ranging from 0.5-1.4.

The silicon and organic antireflective material can be used in combination with any desired photoresist material in the formation of a lithographic semiconductor structure. Preferably, the photoresist can be imaged with low wavelength radiation or with electron beam radiation. Examples of suitable resist materials are U.S. Pat. No. 6,037,097, the disclosure of which is incorporated herein by reference.

The invention is also directed to a process of making a semiconductor structure comprising:

providing a substrate;

providing an organic antireflective material on the substrate;

providing a silicon antireflective material on the organic antireflective material, wherein the silicon antireflective material comprises a crosslinked polymer with a $SiO_x$ backbone, a chromophore attached to the $SiO_x$ backbone; and an organic group that is substantially transparent to 193 nm or 157 nm radiation, depositing a photoresist on the silicon anti reflective material, pattern expose the photoresist to radiation, and remove portions of the photoresist to expose the silicon antireflective material, removing portions of the silicon antireflective material to expose the organic antireflective material;

removing portions of the organic antireflective material to expose portions of the substrate; and removing portions of the substrate Any remaining portions of the photoresist, the silicon antireflective material, and the organic antireflective material are then removed to provide a patterned substrate.

An organic antireflective composition is applied, preferably by spin-coating, to a substrate, e.g., a dielectric or metal material, to be patterned. The deposited organic, polymer composition is then heated to remove solvent and cure (crosslink) the composition. The silicon polymer composition is then applied to the organic antireflective material by spin coating and cured. A radiation-sensitive resist material can then be applied (directly or indirectly) on the silicon antireflective material.

Typically, the solvent-containing resist composition is applied using spin coating or another technique. The photoresist coating is then typically heated (pre-exposure baked) to remove the solvent and improve the coherence of the photoresist material. The pre-exposure bake temperature may vary depending on the glass transition temperature of the photoresist. The thickness of the photoresist is preferably designed as thin as possible with the provisos that the thickness is substantially uniform and that the photoresist material be sufficient to withstand subsequent processing (typically reactive ion etching) to transfer the lithographic pattern.

After solvent removal, the resist material is then patternwise-exposed to the desired radiation (e.g. 193 nm ultraviolet radiation). Where scanning particle beams such as electron beam are used, patternwise exposure can be achieved by scanning the beam across the substrate and selectively applying the beam in the desired pattern. If ultraviolet radiation is used, the patternwise exposure is conducted through a mask which is placed over the resist material. For 193 nm UV radiation, the total exposure energy is about 100 millijoules/cm.sup.2 or less, or about 50 millijoules/cm.sup.2 or less (e.g. 15-30 millijoules/cm.sup.2).

After the desired patternwise exposure, the resist material is typically baked to further complete the acid-catalyzed reaction and to enhance the contrast of the exposed pattern. The post-exposure bake is preferably conducted at about 60.degree. C.-175 degree. C., more preferably about 90 degree. C.-160 degree. C. The post-exposure bake is preferably conducted for about 30 seconds to 5 minutes. After post-exposure bake, the photoresist with the desired pattern is developed by contacting the resist material with an alkaline solution which selectively dissolves the areas of the resist which were exposed to the radiation. Preferred alkaline solutions (developers) are aqueous solutions of tetramethyl ammonium hydroxide. The resulting lithographic structure on the substrate is then typically dried to remove any remaining developer solvent.

In some cases it maybe desirable to remove the resist selectively to the silicon antireflective material as part of a rework process in case of missprocessing of the resist during the lithographic process. The removal of the resist can be accomplished by dissolving the resist in an organic solvent, followed by baking to remove the solvent and the resist. Any solvent dissolving a photoresist is suitable. In some cases it is desirable to use solvents containing bases such as tetramethyl ammonium hydroxide or aqueous based solutions containing ammonium hydroxide. In some cases it is desirable to remove the silicon antireflective material and the photoresist selectively to the organic antireflective material. In this case the solution for removal of the photoresist can contain fluorine. Alternatively, it is possible to etch the resist and/or the silicon antireflective material by a dry strip using a plasma containing fluorine, carbon, hydrogen, chlorine, oxygen, bromine, nitrogen, sulfur and/or mixtures thereof. Of course, a combination of two described methods can also be used.

On advantage provided by the silicon and organic antireflective material is that by optimizing the RIE condition using a reactive ion plasma consisting of C, F, H, N, S O and mixtures thereof, excellent selectivity between the silicon and organic antireflective materials can ensure good pattern transfer. Once the organic antireflective material is patterned, the selective removal of the underlying substrate, e.g., a dielectric, can continue since there is sufficient organic material left for all subsequent etch steps.

In one embodiment, the proper pattern transfer based on the etch selectivity between photoresist, silicon antireflective material and organic antireflective material is exemplified in FIG. 2. By using a fluorocarbon plasma, e.g., $CF_4/O_2$, a reactive ion etch (RIE) process, pattern transfer from the photoresist 10 into the silicon antireflective material 12 is established without consuming much of the photoresist. The high etch selectivity in combination with choosing the appropriate thickness for the silicon antireflective material enables the use of relatively thin photoresists. The pattern is then transferred into the underlying organic antireflective material 14. By using a non-fluorocarbon plasma based RIE process good selectivity between the silicon antireflective material and organic antireflective material is established as well as consumption of the photo resist. Once the organic antireflective material is patterned, the pattern is then transferred to the substrate 16. If the substrate is a dielectric material such as an oxide or low k silicon based dielectrics, then a fluorocarbon based RIE process will likely ensure consumption of the silicon antireflective material as well as good selectivity between the organic material and the dielectric. The remaining organic antireflective material is then removed by methods known to those in the art.

The lithographic structure can also be used to introduce a taper during the etch of the organic antireflective material, which effectively leads to reduction in bottom critical dimension compared to the bottom critical dimension after lithography of contact hole patterning. Introducing a taper during etch of contact holes using the antireflective structure provides an effective shrink method especially for contact hole pattern. Ion sputtering can be used to taper the corner edges of the organic antireflective material.

The lithographic structure can be used to create patterned material structures such as metal wiring lines, holes for contacts or vies, insulation sections (e.g., damascene trenches or shallow trench isolation), trenches for capacitor structures, etc, as might be used in the design of integrated circuit devices. The lithographic structure is especially useful in the context of creating patterned materials of substrates such as oxides, nitrides or polysilicon.

Examples of general lithographic processes where the lithographic structure can be useful are disclosed in U.S. Pat. Nos. 4,855,017; 5,362,663; 5,429,710; 5,552,801; 5,618,751; 5,744,376; 5,801,094; 5,821,469 and 5,948,570. Other examples of pattern transfer processes are described in Chapters 12 and 25 of "Semiconductor Lithography, Principles, Practices, and Materials" by Wayne Moreau, Plenum Press, (1988), the disclosure of which is incorporated herein by reference. It should be understood that the invention is not limited to any specific lithographic technique or device structure.

EXAMPLE 1

Silicon and Organic Antireflective Materials Deposited by Spin Coating

The organic polymer composition, NFC-1400, commercially available from JSR Microelectronics vas spin coated onto an oxide wafer at 3995 rpm and baked at 170 degree. C. for 60 sec providing an organic antireflective material of a thickness of 200 nm and the optical constants of n=1.7 and k=0.8 k (193 nm). The silicon polymer composition, SHBA470, available from Shin-Etsu Chemical, was spin coated onto the organic antireflective material at 3000 rpm and baked at 200 degree. C. for 120 sec providing a silicon antireflective material with a thickness of 20 to 35 nm and optical constants of n=1.85 and k=0.2 (193 nm).

EXAMPLE 2

193 nm Lithography and Etching the Antireflective Materials

The antireflective materials were formed as described in Example 1. A material of acrylic-based photoresist (available from JSR Microelectronics and Shin-Etsu) was spin-coated over the silicon antireflective material to a thickness of about 250 nm. The photoresist was baked at 130° C. for 60 sec. The photoresist was imaged using a 0.75 NA ASML Stepper with conventional and annular illumination using a APSM reticle. After patternwise exposure, the photoresist was baked at 130° C. for 60 sec. The image was then developed using commercial developer (0.26M TMAH). The resulting pattern showed 90 nm lines with different pitches as well as isolated and nested 120 nm contact holes.

EXAMPLE 3

The photoresist of Example 2 was selectively removed to SHB A470 on top of NFC-1400 (Example 1) by applying a solvent mixture of γ-butyrolactone and butylacetate after patterning. Then the photoresist was reapplied (the wafer was spun at 3000 rpm for 30 sec followed by a bake of 130° C. for 30 sec) and exposed as described in Example 2 to give lines and spaces pattern that were in size and profile identical to the patterns obtained on SHBA470 and NFC 1400 (Example 1) without solvent rinse The pattern (lines and spaces as well as contact holes) were then transferred into the silicon material (Example 1) by a fluorocarbon plasma using a LAM RIE tool. The etch selectivity between the photoresist and the silicon antireflective material exceeded 3:1 demonstrating that little consumption of photoresist is lost during the silicon antireflective material open etch. The pattern was transferred by a nitrogen hydrogen based etch into the organic antireflective material. During this step the photoresist was almost completely consumed, however, the silicon antireflective material showed no significant degradation. The pattern was transferred into a material of 300 nm oxide by a fluorocarbon plasma RIE process, which completely consumes the silicon antireflective material. The remaining organic antireflective material was stripped by a nitrogen, hydrogen etch.

EXAMPLE 4

Shrink by Etch

After etching through the antireflective materials (Example 1, SHBA470 and NFC1400) using CF based RIE chemistry for the silicon antireflective material and nitrogen hydrogen based RIE chemistry for the organic antireflective material, a reduction of bottom critical dimension of 15-20 nm was observed in the contact hole patterned in Example 2 indicating that the antireflective structure can be used as an effective contact shrink method via RIE.

We claim:

1. A lithographic structure comprising:
   an organic antireflective material disposed on a substrate; and
   a silicon antireflective material disposed on the organic antireflective material, wherein the silicon antireflective material comprises a crosslinked polymer with a $SiO_x$ backbone, a chromophore attached to the $SiO_x$ backbone, and a transparent organic group that is substantially transparent to 193 nm or 157 nm radiation,
   wherein the silicon antireflective material and the organic antireflective material together provide a reflectivity below 0.5% up to numerical aperture (NA) of 1.4, and
   wherein the silicon antireflective material comprises the silicon backbone of

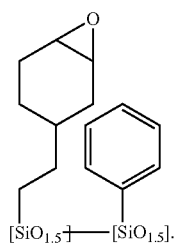

2. The lithographic structure of claim 1 wherein the chromophore provides the site for crosslinking.

3. The lithographic structure of claim 1 wherein the chromophore is selected from the group consisting of phenyl, phenol, naphthalene, and an unsaturated organic group.

4. The lithographic structure of claim 1 wherein the crosslinked polymer further comprises a reaction product resulting from the reaction of a thermal acid generator.

5. The lithographic structure of claim 1 wherein the transparent organic group that is substantially transparent provides the site of crosslinking.

6. The lithographic structure of claim 5 wherein the transparent organic group includes one or more organic functional group selected from an epoxide, alcohol, acetoxy, ester or ether.

7. The lithographic structure of claim 5 wherein the transparent organic group is a cycloaliphatic epoxide.

8. The lithographic structure of claim 1 wherein the transparent organic group is a hydrofluorocarbon or perfluorocarbon.

9. The lithographic structure of claim 1 wherein the crosslinked polymer comprises units of a glycoluril compound.

10. The lithographic structure of claim 1 wherein the organic antireflective material comprises a polymer with crosslinked phenolic sites, and a number average molecular weight of about 2,000 to about 10,000.

11. The lithographic structure of claim 1 further comprising a photoresist on the silicon antireflective material.

12. The lithographic structure of claim 1 wherein the organic antireflective material has an index of refraction (n) of 1.3-2.0 and an extinction coefficient (k) of 0.4-0.9, at 193 nm radiation, and the silicon antireflective material has an index of refraction (n) of 1.5-2.2 and an extinction coefficient (k) of 0.1-0.8 at 193 nm radiation.

13. The lithographic structure of claim 1 wherein the silicon antireflective material has a thickness of $T_k$ and the organic antireflective material has a thickness of about $2T_k$ to about $12T_k$, wherein the thickness $T_k$ is in nanometers.

14. An antireflective material comprising an organic antireflective material and a silicon antireflective material disposed on the organic antireflective material, wherein the silicon antireflective material comprises:
   a crosslinked polymer with a $SiO_x$ backbone;
   a chromophore attached to the $SiO_x$ backbone; and
   a transparent organic group that is substantially transparent to 193 nm or 157 nm radiation,
   wherein the silicon antireflective material and the organic antireflective material together provide a reflectivity below 0.5% up to numerical aperture (NA) of 1.4, and
   wherein the silicon antireflective material comprises the silicon backbone of

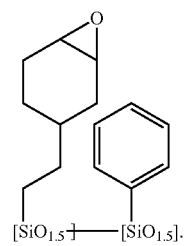

15. The antireflective material of claim 14 wherein the silicon antireflective material further comprises a reaction product resulting from the reaction of a thermal acid generator.

16. The antireflective material of claim 14 wherein the transparent organic group provides the site of crosslinking, and is one or more organic functional groups selected from an epoxide, alcohol, acetoxy, ester or ether.

17. The antireflective material of claim 16 wherein the transparent organic group is a cycloaliphatic epoxide.

18. The antireflective material of claim 14 wherein the organic antireflective material has an index of refraction (n) of 1.3-2.0 and an extinction coefficient (k) of 0.4-0.9, at 193 nm radiation, and the silicon antireflective material has an index of refraction (n) of 1.5-2.2 and an extinction coefficient (k) of 0.1-0.8 at 193 nm radiation.

19. The antireflective material of claim 14 wherein the silicon antireflective material has a thickness of $T_k$ and the organic antireflective material has a thickness of about $2T_k$ to about $12T_k$, wherein the thickness $T_k$ is in nanometers.

20. A process of making a lithographic structure comprising:
providing a substrate;
providing an organic antireflective material on the substrate;
providing a silicon antireflective material on the organic antireflective material, wherein the silicon antireflective material comprises a crosslinked polymer with a $SiO_x$ backbone, a chromophore attached to the $SiO_x$ backbone; and a transparent organic group that is substantially transparent to 193 nm or 157 nm radiation,
depositing a photoresist on the silicon antireflective material, pattern expose the photoresist to radiation, and remove portions of the photoresist to expose the silicon antireflective material,
removing portions of the silicon antireflective material to expose the organic antireflective material;
removing portions of the organic antireflective material to expose portions of the substrate; and
removing portions of the substrate,
wherein the deposited silicon antireflective material and the deposited organic antireflective material together provide a reflectivity below 0.5% up to numerical aperture (NA) of 1.4, and
wherein the silicon antireflective material comprises the silicon backbone of

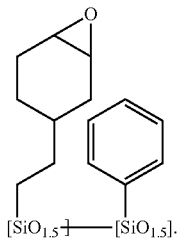

21. The process of claim 20 wherein removing portions of the silicon antireflective material, and the organic antireflective material is accomplished by reactive ion etching in a plasma.

22. The process of claim 21 wherein the silicon antireflective material further comprises a reaction product resulting from the reaction of a thermal acid generator.

23. The process of claim 21 wherein the removing portions of the organic antireflective material includes introducing a taper.

24. The process of claim 20 wherein the deposited silicon antireflective material has a thickness $T_k$ and the organic antireflective material has a thickness of about $2T_k$ to about $12T_k$, wherein the thickness $T_k$ is in nanometers.

25. A process of claim 20 wherein the silicon backbone is crosslinked with a crosslinking agent of formula

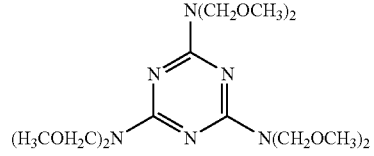

and prepared in the presence of an acid generator of formula

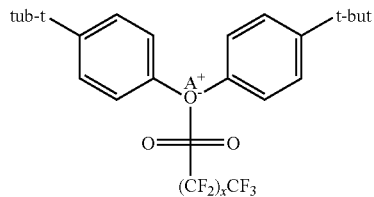

wherein A is S or I, and x is 0 to 7.